(12) United States Patent
Otsubo et al.

(10) Patent No.: US 12,144,159 B2
(45) Date of Patent: Nov. 12, 2024

(54) MODULE

(71) Applicant: Murata Manufacturing Co., Ltd., Kyoto-fu (JP)

(72) Inventors: Yoshihito Otsubo, Nagaokakyo (JP); Takafumi Kusuyama, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 189 days.

(21) Appl. No.: 17/806,290

(22) Filed: Jun. 10, 2022

(65) Prior Publication Data

US 2022/0304201 A1 Sep. 22, 2022

Related U.S. Application Data

(63) Continuation of application No. PCT/JP2020/046232, filed on Dec. 11, 2020.

(30) Foreign Application Priority Data

Dec. 27, 2019 (JP) .................................. 2019-238355

(51) Int. Cl.
*H05K 9/00* (2006.01)
*H05K 1/11* (2006.01)
(Continued)

(52) U.S. Cl.
CPC ........... *H05K 9/0007* (2013.01); *H05K 1/111* (2013.01); *H05K 1/181* (2013.01); *H05K 1/0298* (2013.01);
(Continued)

(58) Field of Classification Search
CPC ..................... H05K 9/0007; H05K 2201/1003
(Continued)

(56) References Cited

U.S. PATENT DOCUMENTS 8,897,019 B1 11/2014 Shimamura et al.
2010/0027225 A1 2/2010 Yuda et al.
(Continued)

FOREIGN PATENT DOCUMENTS

JP 2012-009745 A 1/2012
JP 5517379 B1 6/2014
(Continued)

OTHER PUBLICATIONS

International Search Report for PCT/JP2020/046232 dated Mar. 16, 2021.

*Primary Examiner* — Hung S. Bui
(74) *Attorney, Agent, or Firm* — Pearne & Gordon LLP

(57) ABSTRACT

A module includes a main substrate having a first surface, a sub-module mounted on the first surface, a first component mounted on the first surface separately from the sub-module, and a first sealing resin formed so as to cover the first surface, the sub-module, and the first component. The sub-module includes a second component, a second sealing resin disposed so as to cover the second component, and an internal shielding film formed so as to cover at least a part of a surface of second sealing resin remote from the first surface. A surface of the sub-module remote from the first surface includes a striped section where an area covered with the internal shielding film and an area where the second sealing resin is exposed are alternately arranged.

14 Claims, 10 Drawing Sheets

(51) Int. Cl.
*H05K 1/18* (2006.01)
*H05K 1/02* (2006.01)
(52) U.S. Cl.
CPC ............. *H05K 2201/1003* (2013.01); *H05K 2201/10977* (2013.01)
(58) Field of Classification Search
USPC ........................................................ 361/728
See application file for complete search history.

(56) References Cited

U.S. PATENT DOCUMENTS

| | | |
|---|---|---|
| 2018/0158779 A1 | 6/2018 | Yang et al. |
| 2019/0273312 A1 | 9/2019 | Otsubo |
| 2019/0393166 A1 | 12/2019 | Otsubo |
| 2020/0281102 A1 | 9/2020 | Otsubo et al. |
| 2020/0343151 A1 | 10/2020 | Nomura et al. |
| 2022/0122925 A1 | 4/2022 | Komatsu et al. |
| 2023/0105635 A1* | 4/2023 | Otsubo .................. H05K 1/113 174/260 |
| 2023/0105809 A1* | 4/2023 | Otsubo .................. H05K 1/113 361/760 |

FOREIGN PATENT DOCUMENTS

| | | | |
|---|---|---|---|
| WO | 2008/136251 A1 | 11/2008 | |
| WO | 2018/101384 A1 | 6/2018 | |
| WO | 2018/159482 A1 | 9/2018 | |
| WO | 2018/164158 A1 | 9/2018 | |
| WO | WO-2019004332 A1 * | 1/2019 | ............. H01L 23/00 |
| WO | 2019/098316 A1 | 5/2019 | |
| WO | 2019/138895 A1 | 7/2019 | |
| WO | 2021/006141 A1 | 1/2021 | |

* cited by examiner

MODULE

CROSS REFERENCE TO RELATED APPLICATION

This is a continuation of International Application No. PCT/JP2020/046232 filed on Dec. 11, 2020 which claims priority from Japanese Patent Application No. 2019-238355 filed on Dec. 27, 2019. The contents of these applications are incorporated herein by reference in their entireties.

BACKGROUND OF THE DISCLOSURE

Field of the Disclosure

The present disclosure relates to a module.

Description of the Related Art

A module having a structure where components are mounted on a circuit substrate and encapsulated in a sealing resin, and a shield is further provided is disclosed in Japanese Patent No. 5517379 (PTL 1). As disclosed in PTL 1, a trench formed, on the sealing resin, between the plurality of components thus mounted are filled with a conductive material. The shield includes an external shield portion disposed so as to cover an upper and side surfaces of the sealing resin, and an internal shield portion formed by the conductive material in the trench.
PTL 1: Japanese Patent No. 5517379

BRIEF SUMMARY OF THE DISCLOSURE

In order to manufacture the module disclosed in PTL 1, laser beam machining is performed to form the trench, but it is necessary to prevent the circuit substrate from being damaged. As disclosed in PTL 1, a surface layer conductor is disposed on a surface of the circuit substrate to receive laser beams, but in order to dispose such a surface layer conductor, it is required that an area of the surface of the circuit substrate corresponding to the surface layer conductor be occupied, so that the degree of freedom in design such as component mounting is restricted. Further, in a case where the mounted component is an inductor, when a distance between the upper surface of the component and a part of the shielding film covering the upper surface of the module is short, eddy currents are induced in the shielding film to make shielding performance insufficient.

It is therefore an object of the present disclosure to provide a module that can suppress induction of eddy currents.

In order to achieve the above-described object, a module according to the present disclosure includes a main substrate having a first surface, a sub-module mounted on the first surface, a first component mounted on the first surface separately from the sub-module, and a first sealing resin formed so as to cover the first surface, the sub-module, and the first component. The sub-module includes a second component, a second sealing resin disposed so as to cover the second component, and an internal shielding film formed so as to cover at least a part of a surface of the second sealing resin remote from the first surface. A surface of the sub-module remote from first surface includes a striped section where an area covered with the internal shielding film and an area where the second sealing resin is exposed are alternately arranged.

According to the present disclosure, the surface of the sub-module remote from the first surface includes the striped section, so that it is possible to obtain a module that can suppress induction of eddy currents.

DETAILED DESCRIPTION OF THE DISCLOSURE

Figure 1:
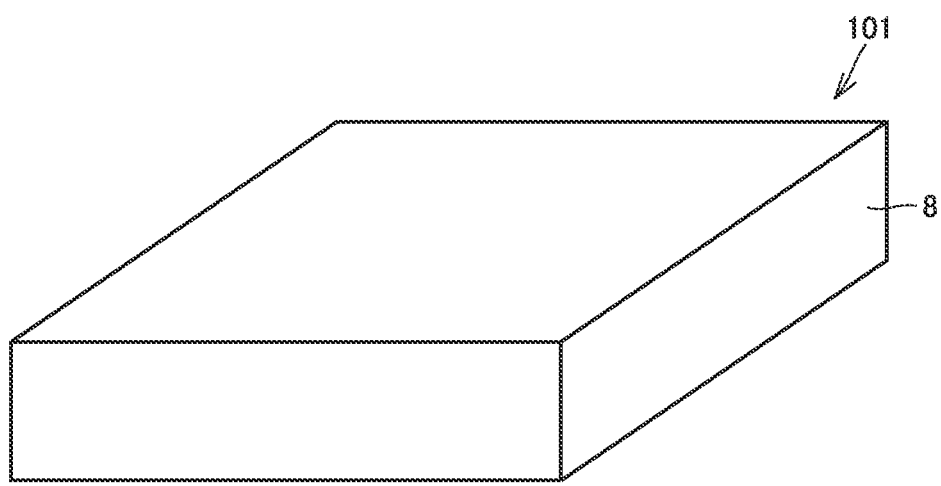
FIG. 1 is a first perspective view of a module according to a first embodiment of the present disclosure.

The dimensional ratios shown in the drawings do not necessarily represent the actual dimensional ratios, and the dimensional ratios may be exaggerated for convenience of description. In the following description, when referring to a superordinate or subordinate concept, it does not necessarily mean an absolute superordinate or subordinate, but may mean a relative superordinate or subordinate in the illustrated modes.

First Embodiment

With reference to FIGS. 1 to 6, a module according to a first embodiment of the present disclosure will be described.

Figure 2:
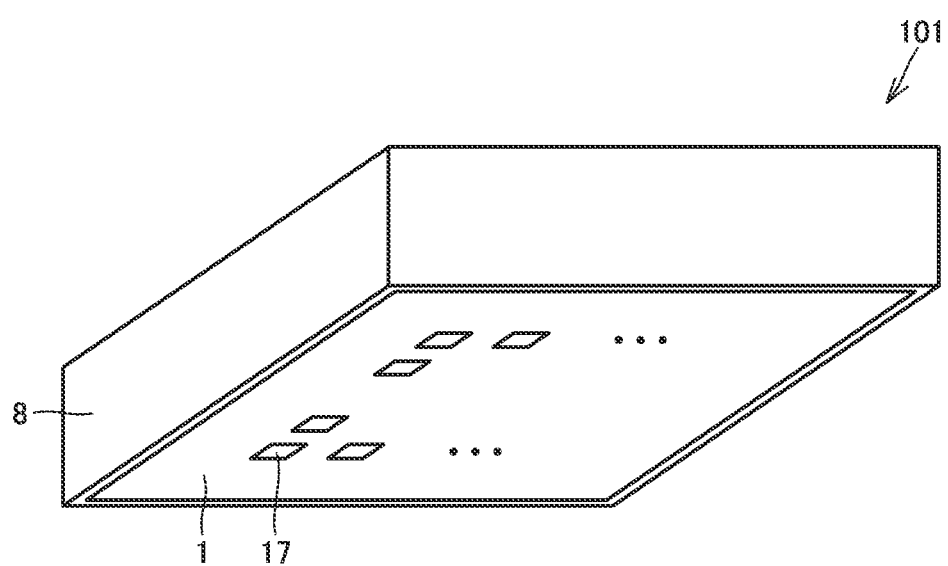
FIG. 2 is a second perspective view of the module according to the first embodiment of the present disclosure.
Figure 3:
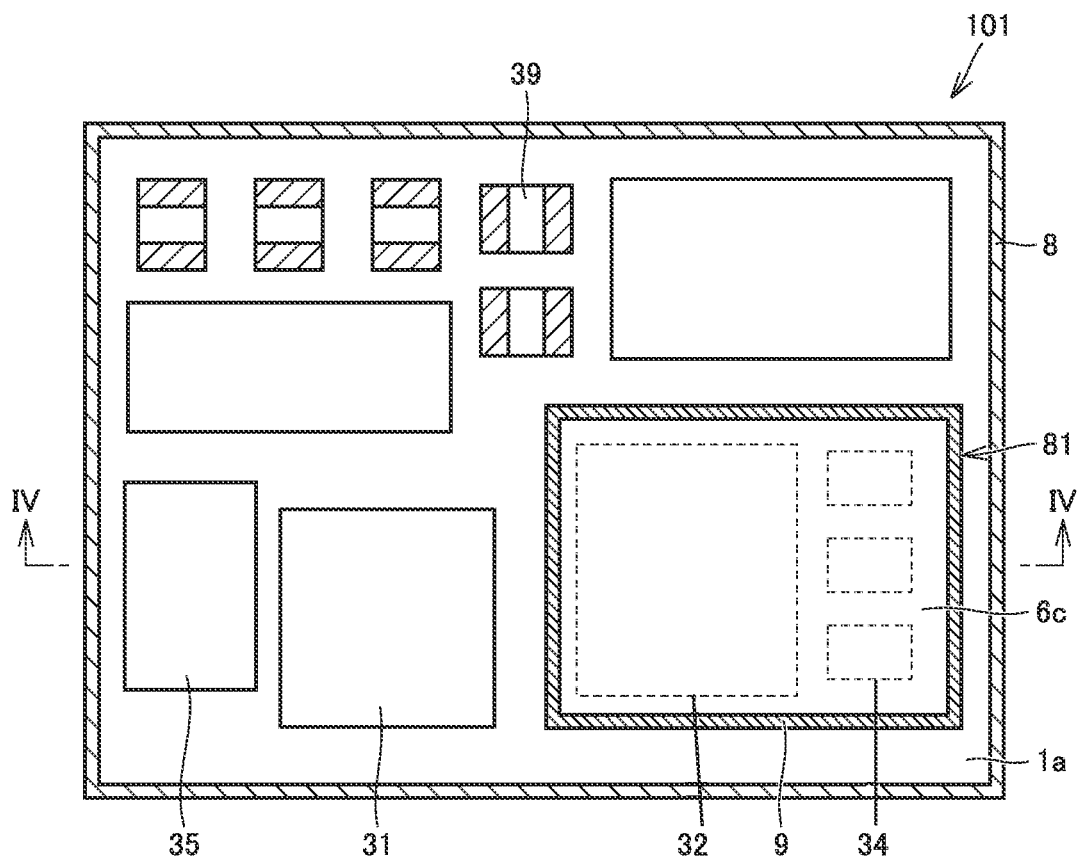
FIG. 3 is a perspective plan view of the module according to the first embodiment of the present disclosure.

FIG. 1 illustrates the appearance of a module 101 according to the present embodiment. An upper surface and side surfaces of module 101 are covered with an external shielding film 8. FIG. 2 illustrates module 101 as viewed obliquely from below in FIG. 1. A lower surface of module 101 is not covered with external shielding film 8, and a substrate 1 is exposed from the lower surface. At least one external terminal 17 is provided on the lower surface of substrate 1. The number, size, and arrangement of external terminals 17 illustrated in FIG. 2 are merely examples. FIG. 3 illustrates a perspective plan view of module 101. FIG. 3 corresponds to a top view of module 101 with the upper surface on external shielding film 8 of module 101 removed, a first sealing resin 6a removed, and the upper surface on internal shielding film 9 of a sub-module 81 removed. A first component 31 is mounted on a first surface 1a of substrate 1. In addition to first component 31, components 35, 39 are mounted on first surface 1a. Sub-module 81 is also mounted on first surface 1a. Sub-module 81 includes a second sealing resin 6c. Components covered with second sealing resin 6c are indicated by dashed lines.

Figure 4:
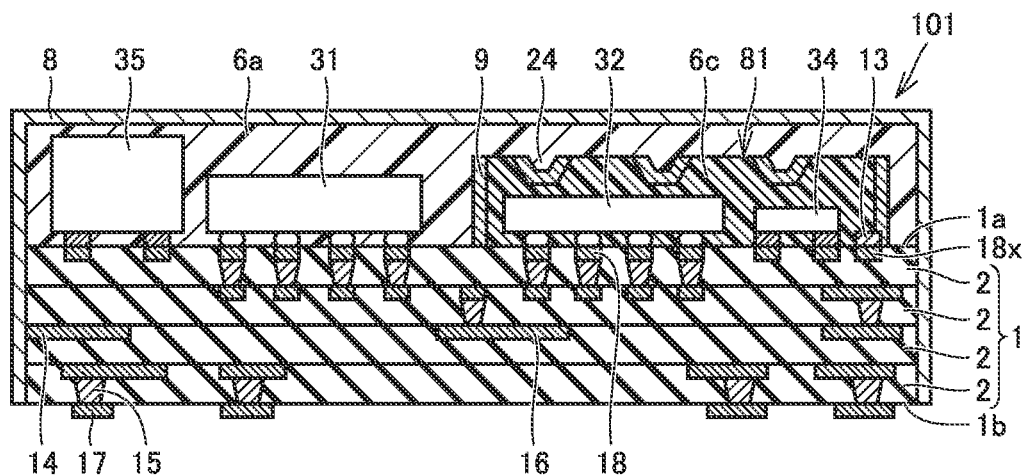
FIG. 4 is a cross-sectional view taken along a line IV-IV, as viewed in the direction of arrows in FIG. 3.

First component 31 may be, for example, an integrated circuit (IC). More specifically, first component 31 may be, for example, a low noise amplifier (LNA). FIG. 4 is a cross-sectional view taken along a line IV-IV, as viewed in the direction of arrows in FIG. 3. Substrate 1 may include wiring thereon or therein. Substrate 1 may be a resin substrate or a ceramic substrate. Substrate 1 may be a multilayer substrate. In the example illustrated in FIG. 4, substrate 1 is formed of a laminate of a plurality of insulating layers 2. Each insulating layer 2 is, for example, a resin layer.

Figure 5:
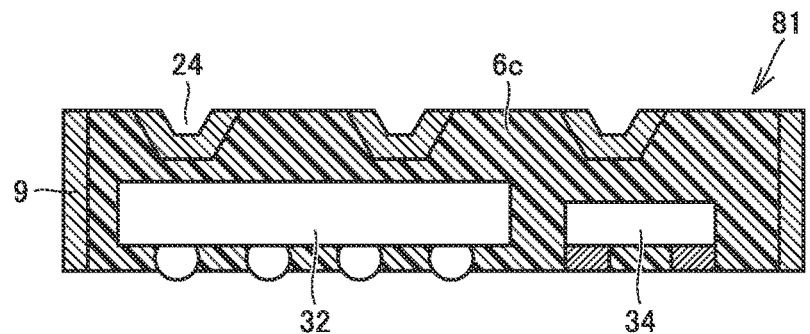
FIG. 5 is a cross-sectional view of a sub-module contained in the module according to the first embodiment of the present disclosure.
Figure 6:
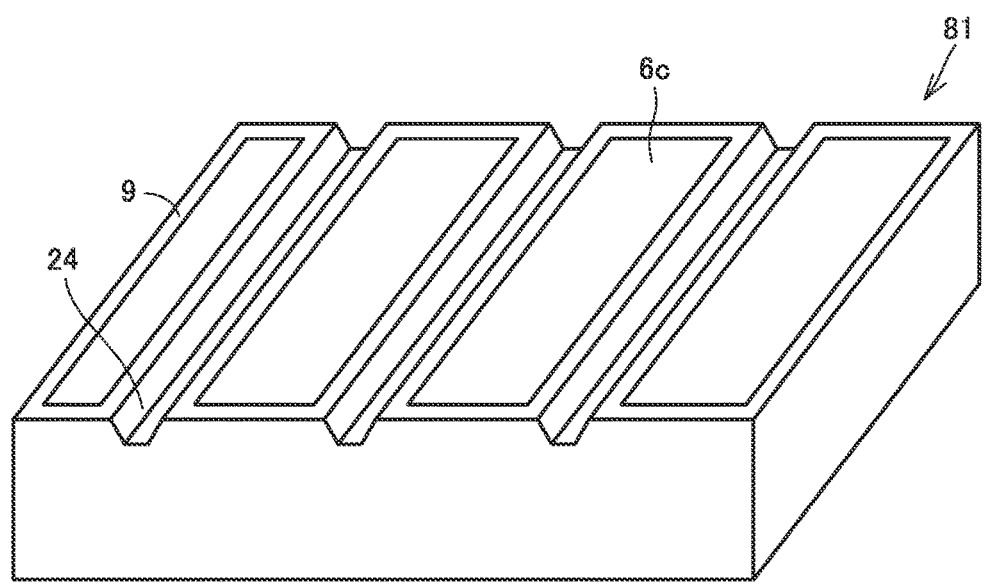
FIG. 6 is a perspective view of the sub-module contained in the module according to the first embodiment of the present disclosure.

Module 101 according to the present embodiment includes main substrate 1 having first surface 1a, sub-module 81 mounted on first surface 1a, first component 31 mounted on first surface 1a separately from sub-module 81, and first sealing resin 6a formed so as to cover first surface 1a, sub-module 81, and first component 31. FIG. 5 illustrates sub-module 81 taken out alone. FIG. 6 is a perspective view of sub-module 81. Sub-module 81 includes a second component 32, second sealing resin 6c disposed so as to cover second component 32, and internal shielding film 9 formed so as to cover at least a part of a surface of second sealing resin 6c remote from first surface 1a. Sub-module 81 is formed smaller in area than main substrate 1. A surface of sub-module 81 remote from first surface 1a includes a striped section where an area covered with internal shielding film 9 and an area where second sealing resin 6c is exposed are alternately arranged.

As illustrated in FIG. 4, a plurality of pad electrodes 18 are arranged on first surface 1a of main substrate 1, and first component 31 and second component 32 are each mounted using pad electrodes 18. Component 35 is also mounted using pad electrodes 18.

As illustrated in FIG. 4, module 101 includes external shielding film 8 formed so as to cover a surface of first sealing resin 6a remote from first surface 1a and side surfaces of first sealing resin 6a, and side surfaces of main substrate 1.

As illustrated in FIG. 4, pad electrode 18x is disposed on first surface 1a of main substrate 1. Pad electrode 18x is grounded through a wire (not illustrated). Sub-module 81 includes a ground connection electrode 13 so as to electrically connect to pad electrode 18x. Ground connection electrode 13 is electrically connected to internal shielding film 9. Such connection establishes a ground for internal shielding film 9.

Sub-module 81 includes a component 34 in addition to second component 32. Component 34 is also mounted using pad electrodes 18. A ground conductor pattern 14 is disposed inside main substrate 1. Ground conductor pattern 14 is exposed from a side surface of main substrate 1 and is electrically connected to external shielding film 8. Main substrate 1 includes a conductor via 15 and a conductor pattern 16. Conductor via 15 is electrically connected to external terminal 17. Conductor via 15 and conductor pattern 16 are arranged as desired to form a circuit. Ground conductor pattern 14 is grounded through a circuit (not illustrated) inside main substrate 1.

As illustrated in FIGS. 5 and 6, side surfaces of sub-module 81 are covered with internal shielding film 9. Sub-module 81 has at least one groove 24 on the upper surface. In the example illustrated here, the plurality of grooves 24 parallel to each other are formed on the upper surface of sub-module 81. An inner surface of each groove 24 is covered with internal shielding film 9. In a flat part between grooves 24 on the upper surface of sub-module 81, no internal shielding film 9 is provided, and second sealing resin 6c is exposed accordingly. Here, second component 32 is, for example, an inductor. Further, as viewed from above, the striped section and the inductor as second component 32 overlap each other.

When lines of magnetic force induced by currents flowing through the inductor reach a shielding layer, eddy currents are induced in the shielding layer around the lines of magnetic force. The eddy currents induce a magnetic field that negates a magnetic field caused by the lines of magnetic force. Therefore, the magnetic field induced by the eddy currents may deteriorate electrical characteristics of the inductor. The presence of the striped section, however, makes the induction of the eddy currents less likely to occur. As described in the present embodiment, the configuration where the striped section is provided on the upper surface of sub-module 81 is suitable when a winding axis of a coil is orthogonal to first surface 1a of main substrate 1. When the winding axis of the coil is parallel to first surface 1a of main substrate 1, it is preferable that the striped section be provided on a side surface of sub-module 81.

According to the present embodiment, since the surface of sub-module 81 remote from first surface 1a includes the striped section where the area covered with internal shielding film 9 and the area where second sealing resin 6c is exposed are alternately arranged, eddy currents are less likely to be induced in this surface. Therefore, according to the present embodiment, it is possible to obtain a module that can suppress induction of eddy currents.

In particular, when component 35 taller than second component 32 is contained as a component that is required to be strictly shielded, external shielding film 8 is disposed further above component 35, so that external shielding film 8 tends to be away from second component 32, which makes a shielding effect less than expected. Even in such a case, the present embodiment allows internal shielding film 9 to be disposed near a component that is required to be strictly shielded, that is, second component 32, which makes it possible to obtain a sufficient shielding effect.

As described in the present embodiment, it is preferable that second component 32 be disposed along a surface of sub-module 81 adjacent to first surface 1a, and second component 32 be mounted on first surface 1a. The use of such a configuration can make sub-module 81 thinner and make the module lower in profile in its entirety.

As described in the present embodiment, internal shielding film 9 preferably further covers at least one of the side surfaces of second sealing resin 6c. The use of such a configuration allows sub-module 81 to block lateral electromagnetic waves, thereby making shielding more reliable.

As described in the present embodiment, module 101 preferably includes external shielding film 8 formed so as to cover the surface of first sealing resin 6a remote from first surface 1a and the side surfaces of first sealing resin 6a, and the side surfaces of main substrate 1. The use of such a configuration allows double shielding, that is, external shielding film 8 and internal shielding film 9, to be provided, so that it is possible to sufficiently block electromagnetic waves and thus obtain the module with high reliability.

Figure 7:
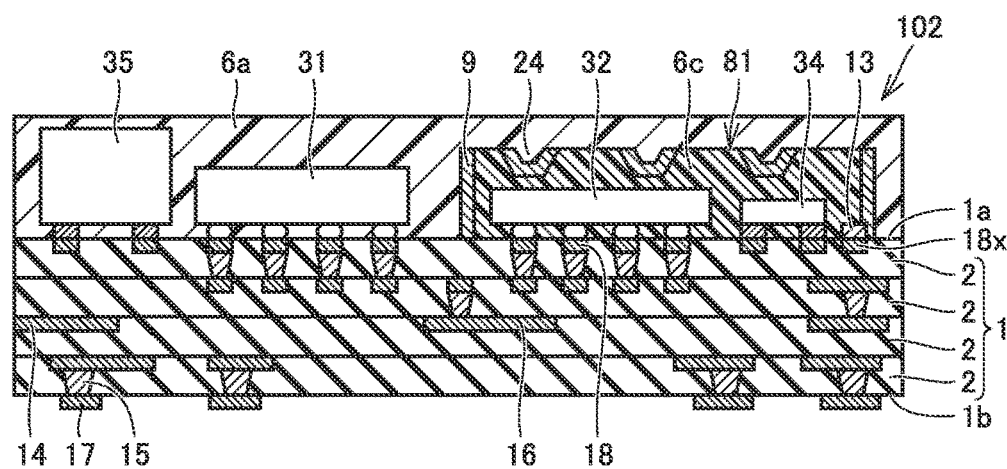
FIG. 7 is a cross-sectional view of a modification of the module according to the first embodiment of the present disclosure.

Note that, in the present embodiment, the example where external shielding film 8 is provided has been described, but a configuration without external shielding film 8 as in a module 102 illustrated in FIG. 7 may be used.

Second Embodiment

Figure 8:
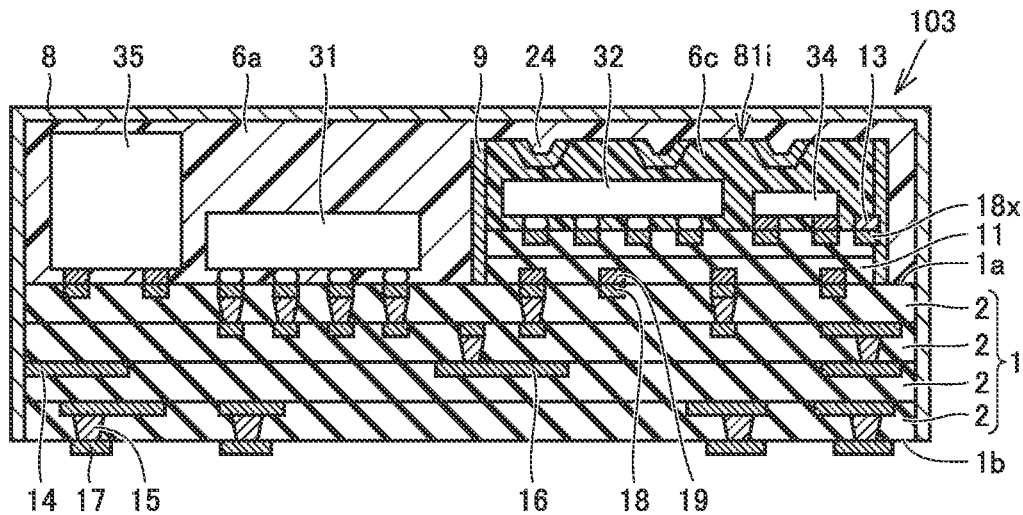
FIG. 8 is a cross-sectional view of a module according to a second embodiment of the present disclosure.

With reference to FIG. 8, a module according to a second embodiment of the present disclosure will be described. FIG. 8 is a cross-sectional view of a module 103 according to the present embodiment. Module 103 is identical in basic configuration to module 101, but differs in the following points.

Module 103 includes a sub-module 81i instead of sub-module 81. Sub-module 81i includes a sub-module substrate 11, second component 32 is mounted on a surface of sub-module substrate 11 remote from first surface 1a, and sub-module substrate 11 is mounted on first surface 1a. Sub-module substrate 11 includes a connection terminal 19 on a surface facing main substrate 1. Connection terminal 19 is electrically connected to pad electrode 18 provided on first surface 1a.

The present embodiment can produce the same effects as the effects of the first embodiment. In the present embodiment, since sub-module 81i includes sub-module substrate 11 as a unique substrate, unique wiring can be provided in sub-module substrate 11. Providing such wiring as appropriate also allows internal shielding film 9 to be grounded. Further, when sub-module 81i is manufactured, components can be mounted on sub-module substrate 11, which makes manufacturing simple.

Third Embodiment

Figure 9:
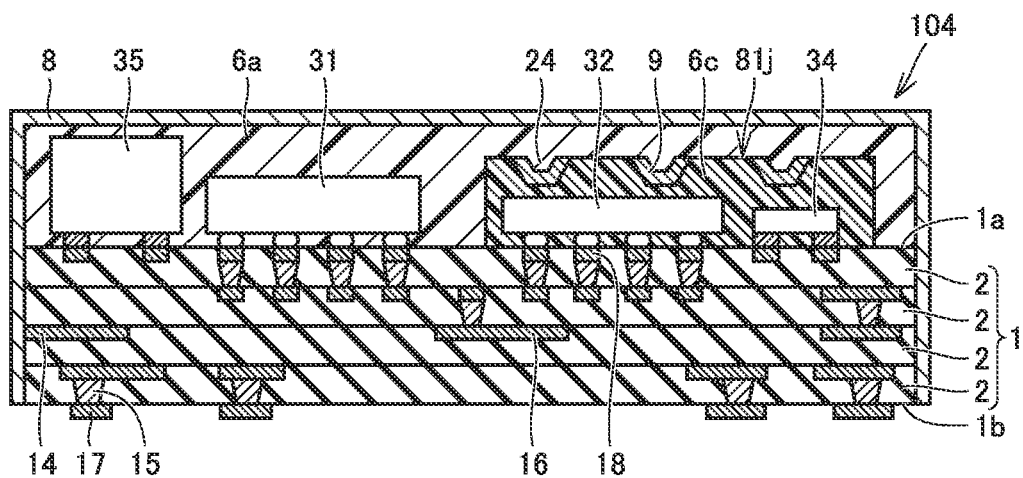
FIG. 9 is a cross-sectional view of a module according to a third embodiment of the present disclosure.

With reference to FIG. 9, a module according to a third embodiment of the present disclosure will be described. FIG. 9 is a cross-sectional view of a module 104 according to the present embodiment. Module 104 is identical in basis configuration to module 101, but differs in the following points.

Module 104 includes a sub-module 81j instead of sub-module 81. None of the side surfaces of sub-module 81j is covered with internal shielding film 9.

The present embodiment can produce the same effects as the effects of the first embodiment. Such a configuration may be used when it is not strictly required to shield the sides of contained second component 32.

Internal shielding film 9 may be disposed so as to cover only some of the side surfaces of sub-module 81j, or alternatively, internal shielding film 9 need not be disposed at all on the side surfaces.

Fourth Embodiment

Figure 10:
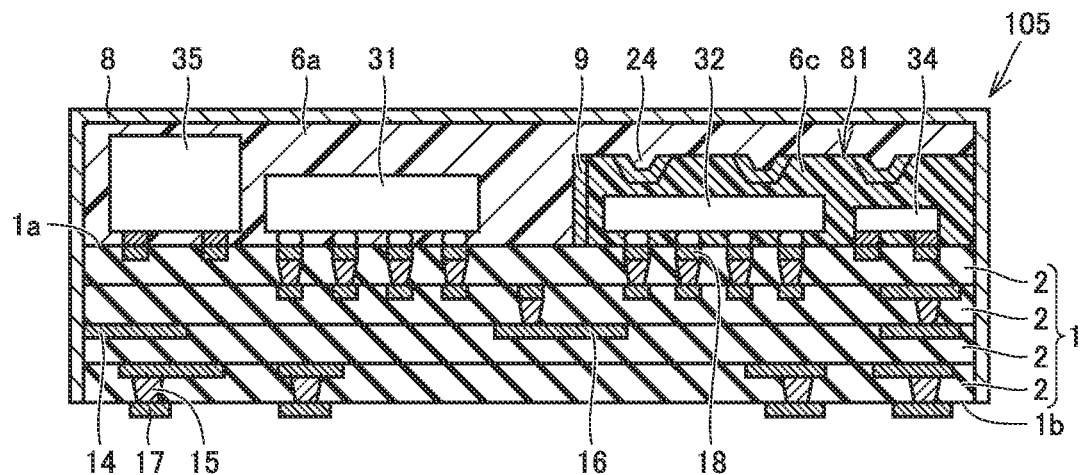
FIG. 10 is a cross-sectional view of a module according to a fourth embodiment of the present disclosure.

With reference to FIG. 10, a module according to a fourth embodiment of the present disclosure will be described. FIG. 10 is a cross-sectional view of a module 105 according to the present embodiment. Module 105 is identical in basis configuration to module 101, but differs in the following points.

In module 105, internal shielding film 9 does not cover some of the side surfaces of second sealing resin 6c, and external shielding film 8 directly covers at least a part of the some of the side surfaces of second sealing resin 6c that is not covered with internal shielding film 9.

The present embodiment can produce the same effects as the effects of the first embodiment. The present embodiment allows sub-module 81 to be disposed as close as possible to an edge of module 105, so that it is possible to save a mountable space on first surface 1a of main substrate 1.

Fifth Embodiment

Figure 11:
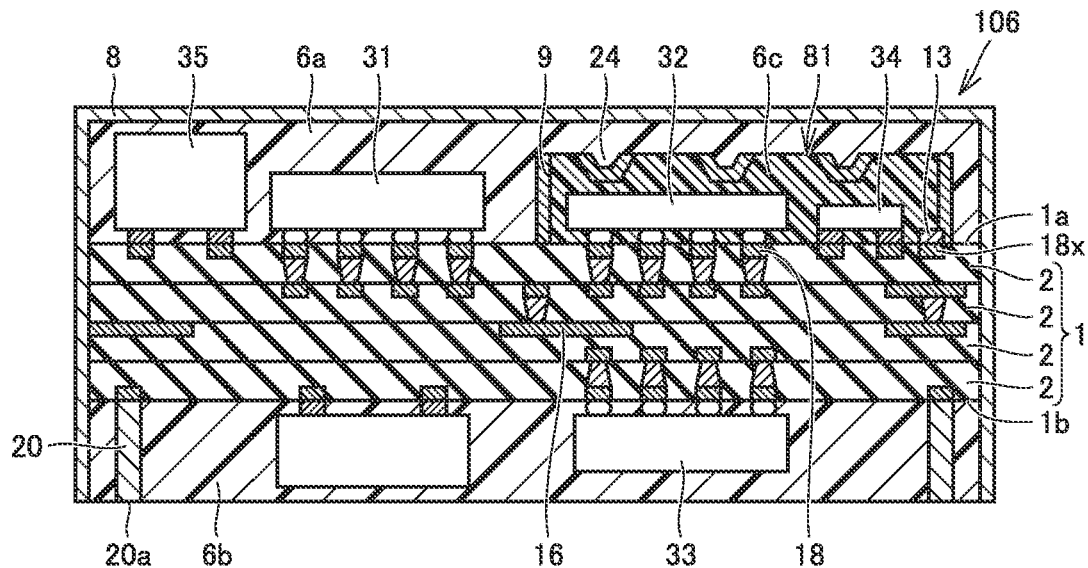
FIG. 11 is a cross-sectional view of a module according to a fifth embodiment of the present disclosure.

With reference to FIG. 11, a module according to a fifth embodiment of the present disclosure will be described. FIG. 11 is a cross-sectional view of a module 106 according to the present embodiment. Module 106 is identical in basis configuration to module 101, but differs in the following points.

In module 106, main substrate 1 has a second surface 1b as a surface on a side opposite from first surface 1a. Module 106 includes a third component 33 mounted on second surface 1b.

A component other than third component 33 may also be mounted on second surface 1b. A third sealing resin 6b is disposed so as to cover second surface 1b and the components mounted on second surface 1b. A columnar conductor 20 is provided in a standing manner on second surface 1b. Columnar conductor 20 passes through third sealing resin 6b in a thickness direction. An end surface 20a of columnar conductor 20 remote from second surface 1b is exposed from third sealing resin 6b and serves as an external terminal.

The present embodiment can produce the same effects as the effects of the first embodiment. The present embodiment allows a component to be mounted on second surface 1b, so that it is possible to mount many components. Even with main substrate 1 having a limited area, it is possible to make module 106 higher in overall mounting density by mounting many components on both the surfaces of main substrate 1.

Sixth Embodiment

Figure 12:
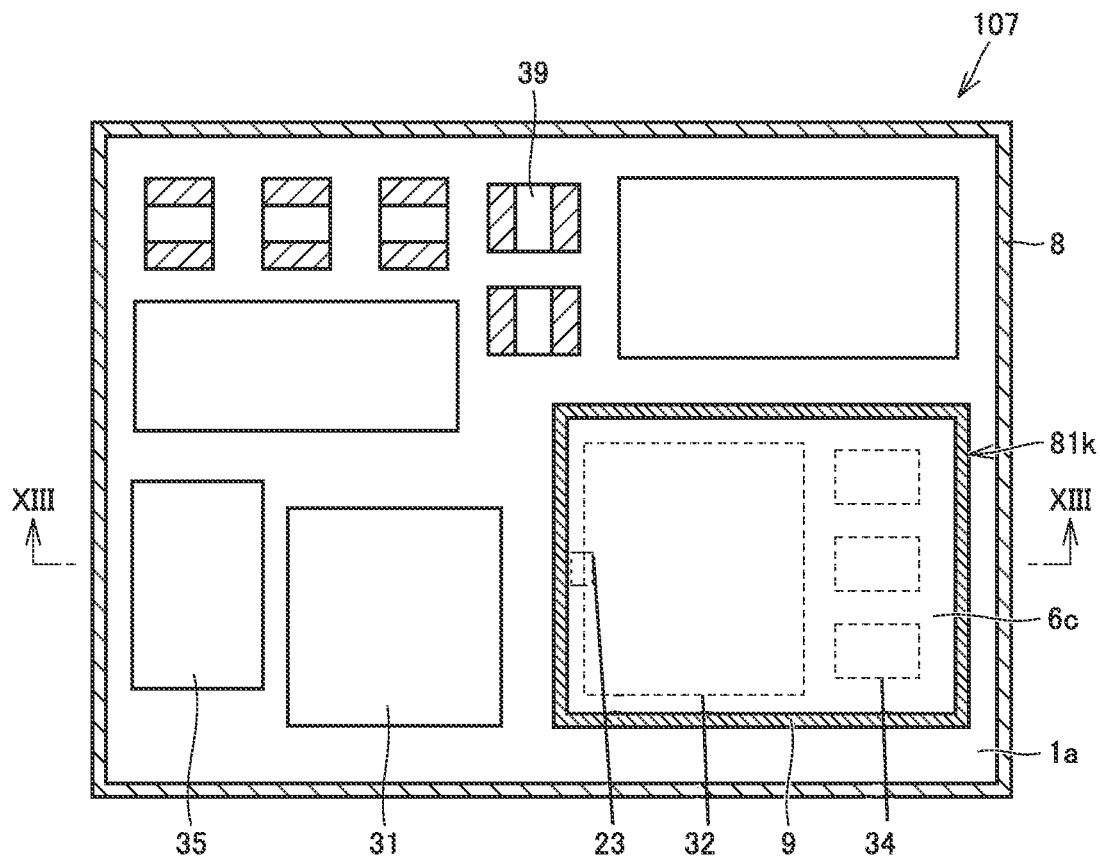
FIG. 12 is a perspective plan view of a module according to a sixth embodiment the present disclosure.

With reference to FIGS. 12 to 15, a module according to a sixth embodiment of the present disclosure will be described. FIG. 12 is a perspective plan view of a module 107 according to the present embodiment. FIG. 12 corresponds to a top view of module 107 with the upper surface on external shielding film 8 of module 107 removed, first sealing resin 6a removed, and the upper surface on internal shielding film 9 of a sub-module 81k removed. First component 31 is mounted on first surface 1a of substrate 1. In addition to first component 31, components 35, 39 are mounted on first surface 1a. Sub-module 81k is also mounted on first surface 1a. Sub-module 81k includes second sealing resin 6c. Components covered with second sealing resin 6c are indicated by dashed lines.

Figure 13:
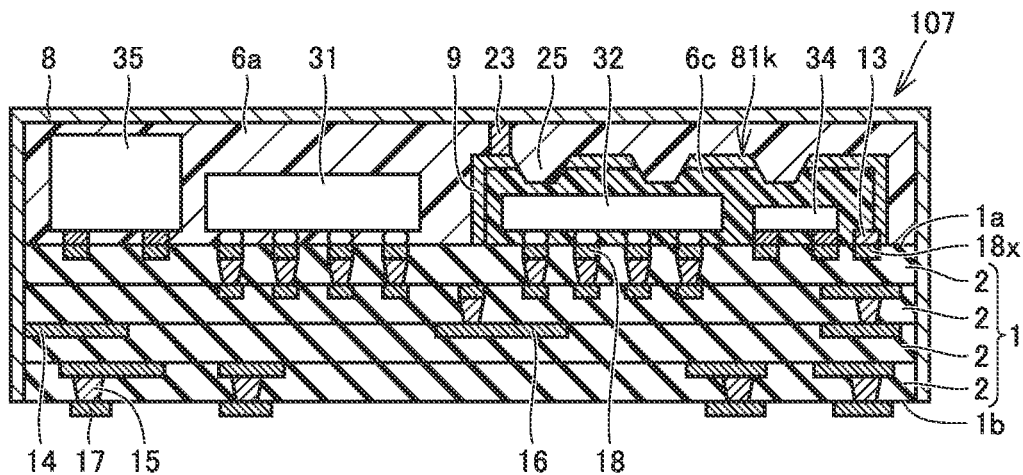
FIG. 13 is a cross-sectional view taken along a line XIII-XIII, as viewed in the direction of arrows in FIG. 12.

FIG. 13 is a cross-sectional view taken along a line XIII-XIII, as viewed in the direction of arrows in FIG. 12. A connection conductor 23 is disposed so as to electrically connect to internal shielding film 9 covering the upper surface of sub-module 81k. Connection conductor 23 electrically connects a part of external shielding film 8 covering the upper surface of second sealing resin 6c and internal shielding film 9. This establishes a ground for internal shielding film 9.

Figure 14:
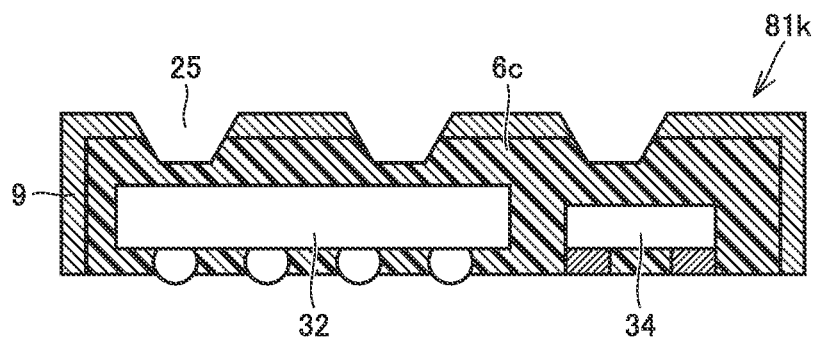
FIG. 14 is a cross-sectional view of a sub-module contained in the module according to the sixth embodiment of the present disclosure.
Figure 15:
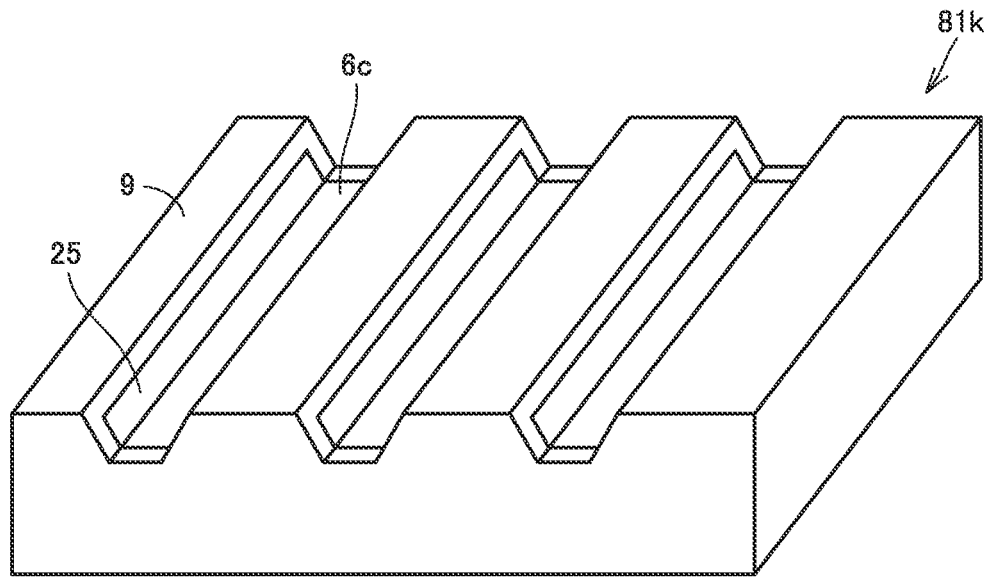
FIG. 15 is a perspective view of the sub-module contained in the module according to the sixth embodiment of the present disclosure.

FIG. 14 illustrates sub-module 81k taken out alone. FIG. 15 is a perspective view of sub-module 81k. As illustrated in FIGS. 14 and 15, the side surfaces of sub-module 81k are covered with internal shielding film 9. Sub-module 81k has at least one groove 25 on the upper surface. In the example illustrated here, the plurality of grooves 25 parallel to each other are formed on the upper surface of sub-module 81k. A flat part between grooves 25 on the upper surface of sub-module 81k is covered with internal shielding film 9. On an inner surface of each groove 25, no internal shielding film 9 is provided, and second sealing resin 6c is exposed accordingly.

Since the surface of sub-module 81k remote from first surface 1a includes striped section where the area covered with internal shielding film 9 and the area where second sealing resin 6c is exposed are alternately arranged, eddy currents are less likely to be induced in this surface. Therefore, the present embodiment can produce the same effects as the effects of the first embodiment.

Seventh Embodiment

Figure 16:
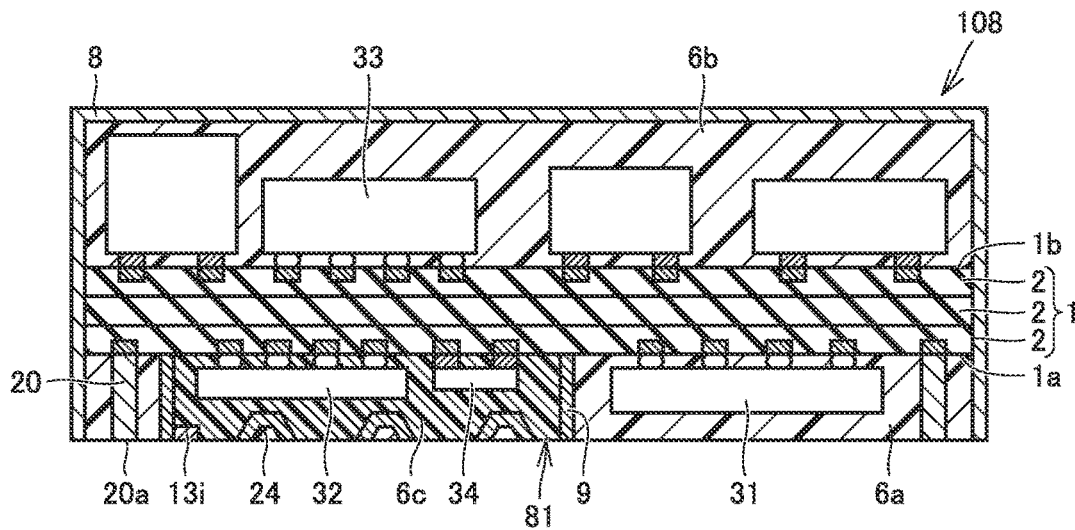
FIG. 16 is a cross-sectional view of a module according to a seventh embodiment of the present disclosure.

With reference to FIG. 16, a module according to a seventh embodiment of the present disclosure will be described. FIG. 16 is a cross-sectional view of a module 108 according to the present embodiment. Module 108 has a positional relationship between first surface 1a and second surface 1b reversed as compared with the embodiments described above. That is, in FIG. 16, the lower surface serves as first surface 1a, and the upper surface serves as second surface 1b. This also makes a positional relationship between first sealing resin 6a and third sealing resin 6b reversed as compared with the embodiments described above.

Module 108 includes main substrate 1 having first surface 1a and second surface 1b on a side opposite from first surface 1a, sub-module 81 formed smaller in area than main substrate 1 and mounted on first surface 1a, first component 31 mounted on first surface 1a separately from sub-module 81, and first sealing resin 6a formed so as to cover first surface 1a, sub-module 81, and first component 31. Sub-module 81 includes second component 32, second sealing resin 6c disposed so as to cover second component 32, and internal shielding film 9 formed so as to cover at least a part of the surface of second sealing resin 6c remote from first surface 1a. Module 108 further includes third component 33 mounted on second surface 1b, third sealing resin 6b formed so as to cover second surface 1b and third component 33, and external shielding film 8 formed so as to cover the side surfaces of first sealing resin 6a, the side surfaces of main substrate 1, and the surface of third sealing resin 6b remote from second surface 1b and the side surfaces of third sealing resin 6b. The surface of sub-module 81 remote from first surface 1a includes the striped section where the area covered with internal shielding film 9 and the area where second sealing resin 6c is exposed are alternately arranged.

In the present embodiment, when module 108 is mounted on a motherboard or the like, sub-module 81 is positioned on a surface facing the motherboard. Even such a configuration can produce the same effects as described in the above-described embodiments.

In module 108 illustrated in FIG. 16, the surface of sub-module 81 remote from first surface 1a is exposed as a part of the lower surface of module 108. Such a configuration may be used. A ground connection conductor 13i is disposed on the surface of sub-module 81 remote from first surface 1a. Ground connection conductor 13i is electrically connected to internal shielding film 9. Ground connection conductor 13i is provided to electrically connect to a ground electrode provided on a motherboard or the like when module 108 is mounted on the motherboard or the like.

First Modification

Sub-module 81 in module 108 illustrated in FIG. 16 may be replaced with sub-module 81k. That is, a module 109 illustrated in FIG. 17 may be used. Module 109 includes sub-module 81k. In sub-module 81k, the flat part between grooves 25 on the surface remote from first surface 1a is covered with internal shielding film 9, so that internal shielding film 9 allows sub-module 81k to electrically connect to a ground electrode provided on a motherboard or the like.

Second Modification

Figure 17:
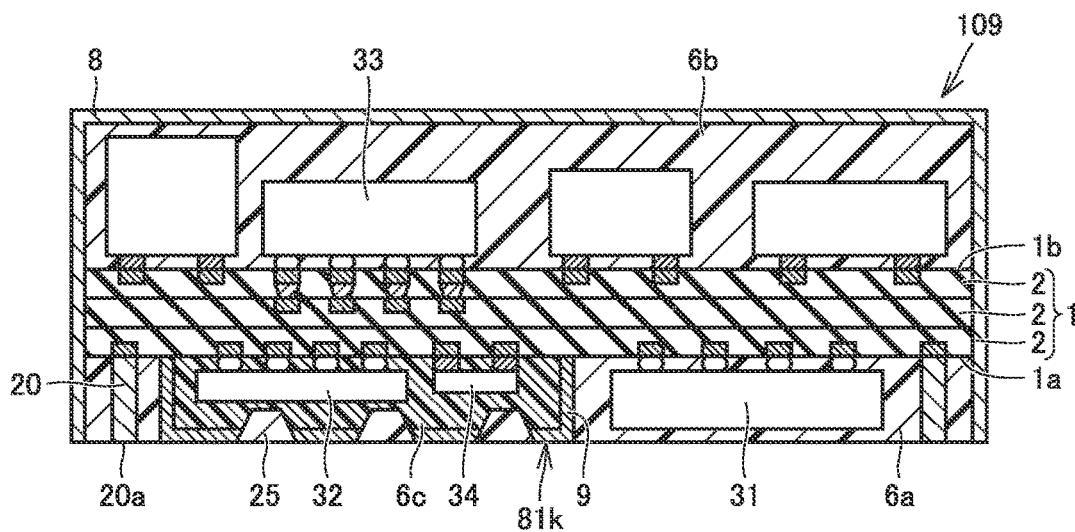
FIG. 17 is a cross-sectional view of a first modification of the module according to the seventh embodiment of the present disclosure.
Figure 18:
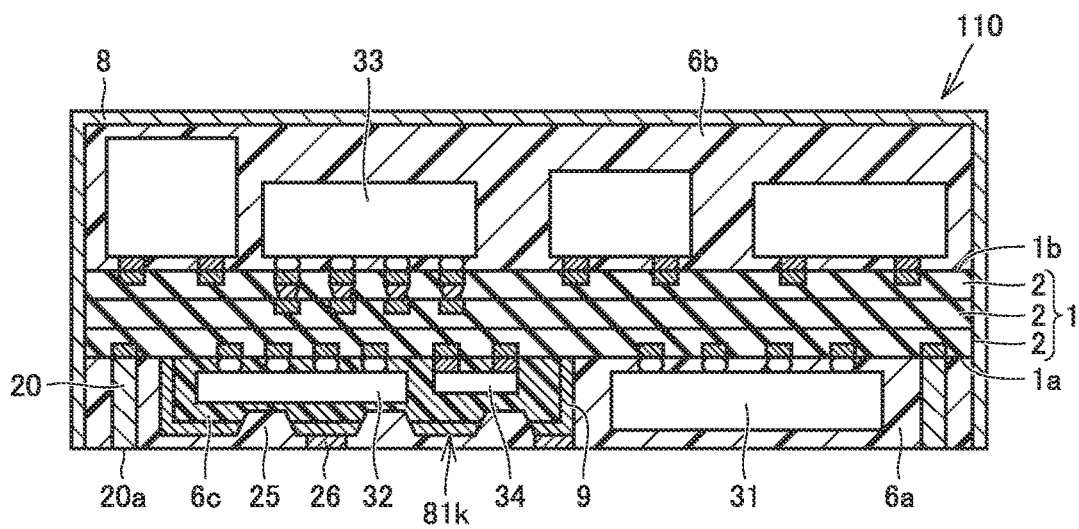
FIG. 18 is a cross-sectional view of a second modification of the module according to the seventh embodiment of the present disclosure.

In FIG. 17, the height of sub-module 81k is equal to the thickness of first sealing resin 6a, but the height of sub-module 81k may be less than the thickness of first sealing resin 6a. That is, a module 110 illustrated in FIG. 18 may be used. Module 110 includes sub-module 81k. A connection conductor 26 is disposed on internal shielding film 9 on the surface of sub-module 81k remote from first surface 1a. Connection conductor 26 is electrically connected to internal shielding film 9 and is exposed on a surface of module 110 that faces, when module 110 is mounted on a motherboard or the like, the motherboard. When module 110 is mounted on the motherboard or the like, connection conductor 26 is electrically connected to a ground electrode provided on the motherboard or the like.

As illustrated in FIG. 16, it is preferable that second component 32 be disposed along the surface of sub-module 81 adjacent to first surface 1a, and second component 32 be mounted on first surface 1a. The use of such a configuration can make sub-module 81 thinner and make the module lower in profile in its entirety. The same applies to sub-module 81k illustrated in FIG. 17.

In module 108 illustrated in FIG. 16, sub-module 81 may be replaced with sub-module 81i illustrated in FIG. 8. That is, in the configuration where module 108 is modified, it is preferable that sub-module 81i include sub-module substrate 11, second component 32 be mounted on the surface of sub-module substrate 11 remote from first surface 1a, and sub-module substrate 11 be mounted on first surface 1a.

With reference to FIGS. 19 to 26, a method for manufacturing module 101 (see FIG. 4) will be described.

Figure 19:
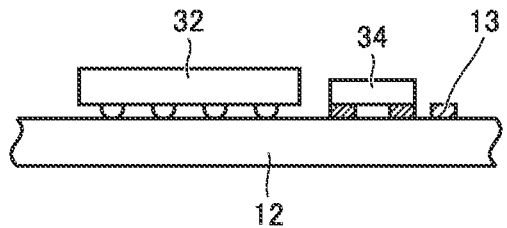
FIG. 19 is a diagram for describing a first process of a method for manufacturing the module according to the first embodiment of the present disclosure.

First, as illustrated in FIG. 19, second component 32 is attached to a surface of a carrier tape 12. Further, some components are attached as necessary. Here, as an example, component 34 is attached. Ground connection electrode 13 is also attached to the surface of carrier tape 12. Carrier tape 12 may be a large-sized carrier tape corresponding to a plurality of sub-modules 81.

Figure 20:
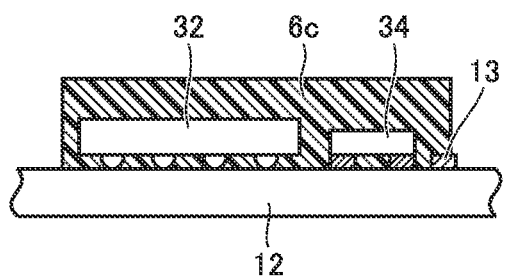
FIG. 20 is a diagram for describing a second process of the method for manufacturing the module according to the first embodiment of the present disclosure.

As illustrated in FIG. 20, second sealing resin 6c is formed so as to encapsulate second component 32 and component 34. Second sealing resin 6c may be first formed into a single large-sized sealing resin and then cut into small pieces with a size corresponding to each sub-module 81. Ground connection electrode 13 is partially covered with second sealing resin 6c, but ground connection electrode 13 is partially exposed from second sealing resin 6c.

Figure 21:
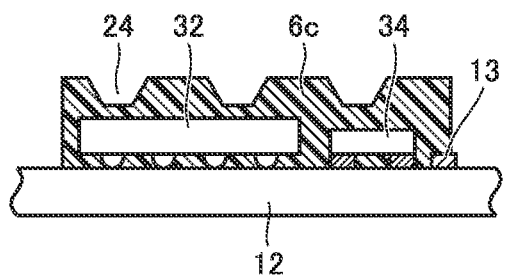
FIG. 21 is a diagram for describing a third process of the method for manufacturing the module according to the first embodiment of the present disclosure.

As illustrated in FIG. 21, groove 24 is formed on the upper surface of second sealing resin 6c. The plurality of grooves 24 are formed parallel to each other.

Figure 22:
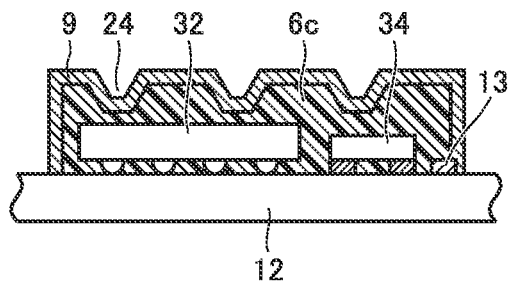
FIG. 22 is a diagram for describing a fourth process of the method for manufacturing the module according to the first embodiment of the present disclosure.

As illustrated in FIG. 22, internal shielding film 9 is formed so as to cover the upper and side surfaces of second sealing resin 6c. Internal shielding film 9 may be formed by sputtering, for example. Internal shielding film 9 may be a single layer or a laminate of a plurality of layers.

Figure 23:
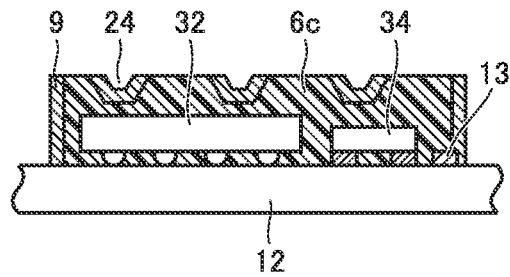
FIG. 23 is a diagram for describing a fifth process of the method for manufacturing the module according to the first embodiment of the present disclosure.

As illustrated in FIG. 23, a surface remote from carrier tape 12 is ground. This removes a part of internal shielding film 9 between grooves 24. Although internal shielding film 9 covering the inner surface of each groove 24 remains, second sealing resin 6c is exposed from the flat surface between grooves 24 where no internal shielding film 9 is present.

Figure 24:
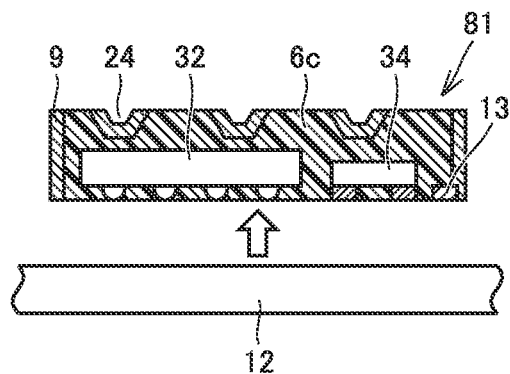
FIG. 24 is a diagram for describing a sixth process of the method for manufacturing the module according to the first embodiment of the present disclosure.

As illustrated in FIG. 24, carrier tape 12 is removed. As a result, sub-module 81 is obtained. Connection terminals of second component 32 and component 34 are exposed from the lower surface of sub-module 81.

Figure 25:
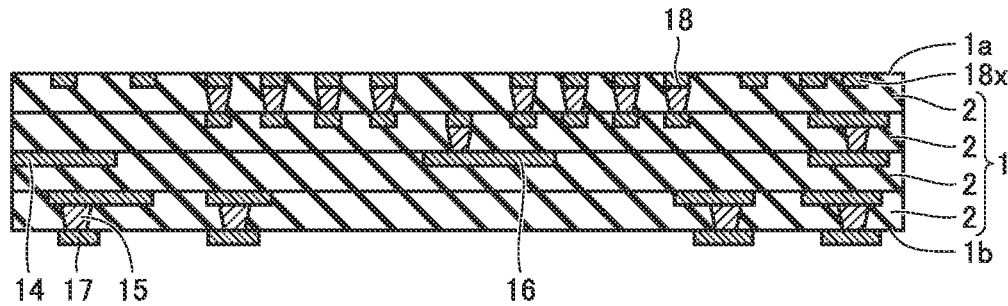
FIG. 25 is a diagram for describing a seventh process of the method for manufacturing the module according to the first embodiment of the present disclosure.

As shown in FIG. 25, the plurality of insulating layers 2 are laminated to prepare main substrate 1. Conductor via 15 and conductor pattern 16 are arranged as desired inside main substrate 1. Ground conductor pattern 14 is disposed so as to be exposed from a side surface of main substrate 1. Main substrate 1 is prepared such that pad electrode 18 is exposed from first surface 1a. Main substrate 1 is prepared such that external terminal 17 is exposed on second surface 1b.

Figure 26:
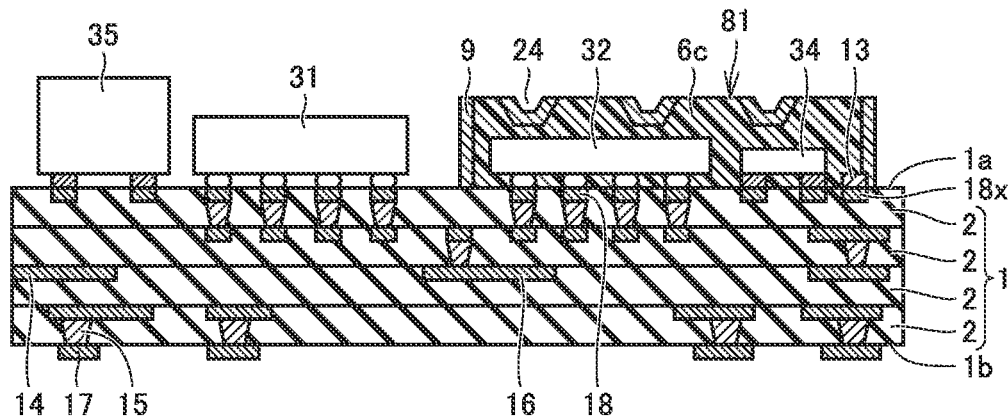
FIG. 26 is a diagram for describing an eighth process of the method for manufacturing the module according to the first embodiment of the present disclosure.

As illustrated in FIG. 26, first component 31, component 35, and sub-module 81 are mounted on first surface 1a of main substrate 1.

First sealing resin 6a is formed, and then external shielding film 8 is formed. As a result, module 101 as illustrated in FIG. 4 is obtained.

Note that the thickness of internal shielding film 9 is preferably less than or equal to the thickness of external shielding film 8. The use of such a configuration can make the module thinner in its entirety.

Figure 27:
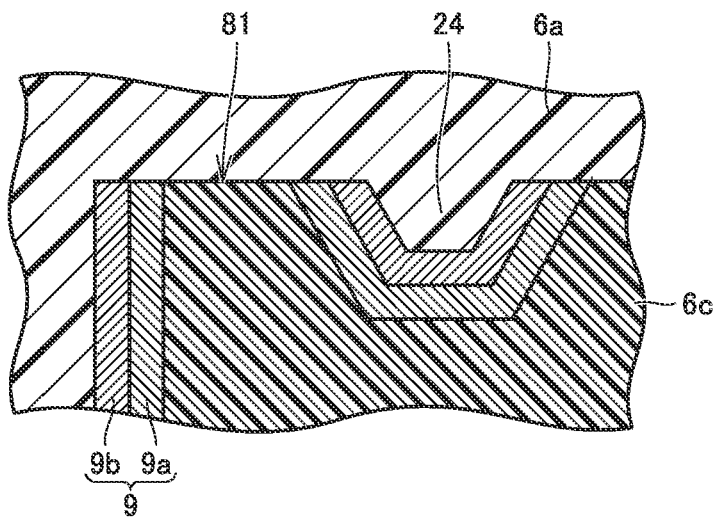
FIG. 27 is a diagram for describing a case where an internal shielding film has a two-layer structure.

Internal shielding film 9 preferably has at least a two-layer structure. FIG. 27 is an enlarged view of a part of module 101 illustrated in FIG. 4. FIG. 27 is an enlarged view of a part in the vicinity of a corner of sub-module 81. Such a two-layer structure allows internal shielding film 9 to have a combination of characteristics of respective materials. In the example illustrated in FIG. 27, the two-layer structure has a stainless steel film 9a and a copper film 9b stacked in order from inside. When the two-layer structure is a combination of stainless steel film 9a and copper film 9b as described above, stainless steel film 9a can make adhesion to second sealing resin 6c high enough, and at the same time, copper film 9b can make conductivity high enough. As the shielding film, a three-layer structure is usually employed in which three layers of an adhesion layer typified by a stainless steel film that makes adhesion to resin high enough, a conductive layer typified by a copper film that has shielding properties, and an anticorrosive layer typified by a stainless steel film that makes the conductive layer resistant to oxidizing are laminated in this order. The configuration like module 101 illustrated in FIG. 4, however, has sub-module 81 embedded in first sealing resin 6a, so that internal shielding film 9 is free from deterioration, which eliminates the need of the anticorrosive layer for internal shielding film 9. In such a configuration, internal shielding film 9 may have a two-layer structure.

Figure 28:
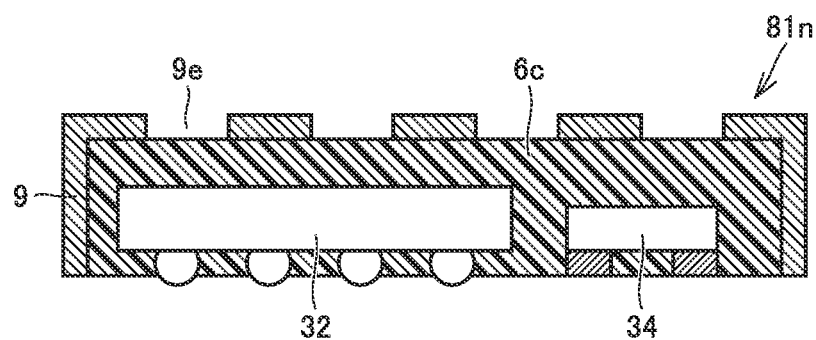
FIG. 28 is a cross-sectional view of an example of the sub-module prepared by etching.

Note that, in the embodiments described above, the example where grooves 24, 25 are formed on the surface of the sub-module to obtain the striped pattern has been described, but the grooves are not necessarily formed. For example, as in a sub-module 81n illustrated in FIG. 28, the striped pattern may be etched into internal shielding film 9. Alternatively, when internal shielding film 9 is formed by sputtering, the striped pattern may be formed by sputtering the sub-module with the top surface of the sub-module covered with a striped mask pattern.

Figure 29:
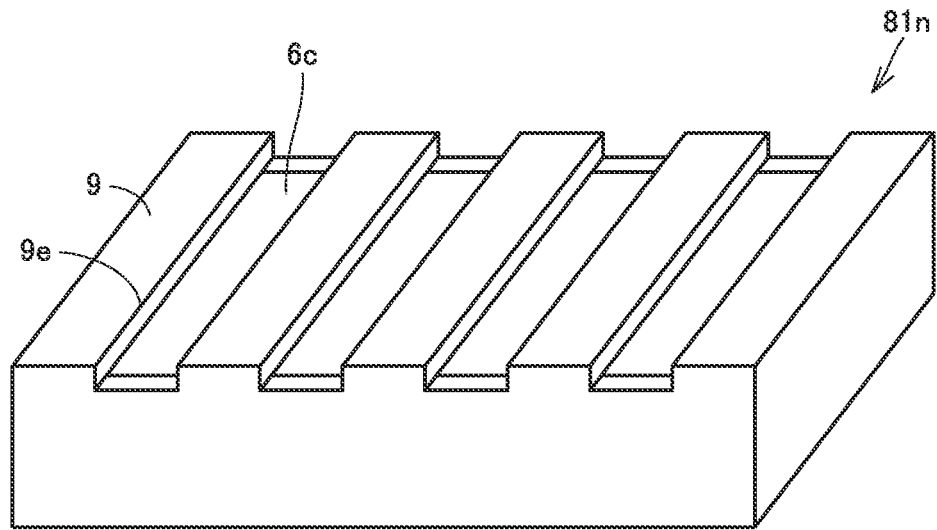
FIG. 29 is a perspective view of the example of the sub-module prepared by etching.

FIG. 29 is a perspective view of sub-module 81n. In sub-module 81n, internal shielding film 9 has an opening 9e. A plurality of linear openings 9e are formed in parallel to each other. From each opening 9e, second sealing resin 6c is exposed. Such processing can also form the striped section by alternately arranging the area covered with internal shielding film 9 and the area where second sealing resin 6c is exposed.

When the winding axis of the coil is parallel to first surface 1a of main substrate 1, it is preferable that the striped section be formed on a side surface of the sub-module. In this case as well, the striped section may be formed on the side surface of the sub-module by a suitable method. For example, the striped pattern may be formed on the side surface by etching. Alternatively, the striped pattern may be formed by sputtering the sub-module with the side surface of the sub-module covered with a striped mask pattern. Alternatively, the striped pattern may be formed by grooves formed on the side surface of the sub-module.

Note that, in each of the above-described embodiments, the example where only one sub-module is provided in one module has been described, but a plurality of sub-modules may be provided in one module. At least one sub-module may be mounted on each of first surface 1a and second surface 1b of main substrate 1.

Note that a combination of some of the embodiments may be employed as needed.

Note that the embodiments disclosed herein are illustrative in all respects and are not restrictive. The scope of the present disclosure is set forth by the claims, and the present disclosure is intended to include the claims, equivalents of the claims, and all modifications within the scope.

1: main substrate, 1a: first surface, 1b: second surface, 2: insulating layer, 6a: first sealing resin, 6b: third sealing resin, 6c: second sealing resin, 8: external shielding film, 9: internal shielding film, 9a: stainless steel film, 9b: copper film, 9e: opening, 11: sub-module substrate, 12: carrier tape, 13, 13i: ground connection electrode, 14: ground conductor pattern, 15: conductor via, 16: conductor pattern, 17: external terminal, 18, 18x: pad electrode, 19: connection terminal, 20: columnar conductor, 20a: end surface, 23, 26: connection conductor, 24, 25: groove, 31: first component, 32: second component, 33: third component, 34, 35, 39: component, 81, 81i, 81j, 81k, 81n: sub-module, 101, 102, 103, 104, 105, 106, 107, 108, 109, 110: module

The invention claimed is:

1. A module comprising:
a main substrate having a first surface;
a sub-module mounted on the first surface;
a first component mounted on the first surface separately from the sub-module; and
a first sealing resin disposed so as to cover the first surface, the sub-module, and the first component, wherein:
the sub-module includes a second component, a second sealing resin disposed so as to cover the second component, and an internal shielding film disposed so as to cover at least a part of a surface of the second sealing resin remote from the first surface,
a surface of the sub-module remote from first surface includes a striped section, wherein in the striped section, an area covered with the internal shielding film and an area where the second sealing resin is exposed are alternately arranged,
the second component is an inductor, and
the striped section and the second component overlap each other as viewed from above.

2. The module according to claim 1, wherein the second component is disposed along a surface of the sub-module adjacent to the first surface, and the second component is mounted on the first surface.

3. The module according to claim 2, wherein the second component is an inductor, and the striped section and the second component overlap each other as viewed from above.

4. The module according to claim 2, wherein the internal shielding film further covers at least one of side surfaces of the second sealing resin.

5. The module according to claim 1, wherein the sub-module includes a sub-module substrate, the second component is mounted on the sub-module substrate, and the sub-module substrate is mounted on the first surface.

6. The module according to claim 5, wherein the internal shielding film further covers at least one of side surfaces of the second sealing resin.

7. The module according to claim 1, wherein the internal shielding film further covers at least one of side surfaces of the second sealing resin.

8. The module according to claim 1, further comprising an external shielding film disposed so as to cover a surface of the first sealing resin remote from the first surface, side surfaces of the first sealing resin, and side surfaces of the main substrate.

9. The module according to claim 8, wherein the internal shielding film does not cover a portion of side surfaces of the second sealing resin, and the external shielding film directly covers at least a part of the portion of the side surfaces of the second sealing resin not covered with the internal shielding film.

10. The module according to claim 8, wherein a thickness of the internal shielding film is less than or equal to a thickness of the external shielding film.

11. The module according to claim 1, wherein the internal shielding film has at least a two-layer structure.

12. The module according to claim 1, wherein the main substrate has a second surface on a side opposite from the first surface, and the module further comprises a third component mounted on the second surface.

13. The module according to claim 1, wherein the striped section is striped in only one direction.

14. A module comprising:
a main substrate having a first surface;
a sub-module mounted on the first surface;
a first component mounted on the first surface separately from the sub-module; and
a first sealing resin disposed so as to cover the first surface, the sub-module, and the first component, wherein:
the sub-module includes a second component, a second sealing resin disposed so as to cover the second component, and an internal shielding film disposed so as to cover at least a part of a surface of the second sealing resin remote from the first surface,
a surface of the sub-module remote from first surface includes a striped section, wherein in the striped section, an area covered with the internal shielding film and an area where the second sealing resin is exposed are alternately arranged, and
the two-layer structure includes a stainless steel film and a copper film stacked in order from inside.

* * * * *